(12) United States Patent
Liaw

(10) Patent No.: US 7,176,125 B2
(45) Date of Patent: Feb. 13, 2007

(54) METHOD OF FORMING A STATIC RANDOM ACCESS MEMORY WITH A BURIED LOCAL INTERCONNECT

(75) Inventor: Jhon-Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 138 days.

(21) Appl. No.: 10/994,908

(22) Filed: Nov. 22, 2004

(65) Prior Publication Data

US 2006/0019488 A1 Jan. 26, 2006

Related U.S. Application Data

(63) Continuation-in-part of application No. 10/898,456, filed on Jul. 23, 2004, now abandoned.

(51) Int. Cl.
H01L 21/4763 (2006.01)
(52) U.S. Cl. ............... 438/637; 257/368; 257/E21.64; 257/E27.05
(58) Field of Classification Search .............. 438/637, 438/723, 599; 257/E21.641, E21.279, E27.059, 257/368, 750, E27.013
See application file for complete search history.

(56) References Cited

U.S. PATENT DOCUMENTS

| | | | |
|---|---|---|---|
| 5,010,032 A | 4/1991 | Tang et al. | |
| 5,330,929 A | 7/1994 | Pfiester et al. | |
| 5,394,358 A | 2/1995 | Huang | |
| 5,827,764 A | 10/1998 | Liaw et al. | |
| 5,831,899 A | 11/1998 | Wang et al. | |
| 5,843,816 A | 12/1998 | Liaw et al. | |
| 5,866,449 A | 2/1999 | Liaw et al. | |
| 5,930,633 A | 7/1999 | Liaw | |
| 5,955,768 A | 9/1999 | Liaw et al. | |
| 5,970,375 A * | 10/1999 | Gardner et al. | 438/637 |
| 5,998,249 A | 12/1999 | Liaw et al. | |
| 6,013,547 A | 1/2000 | Liaw | |
| 6,239,458 B1 | 5/2001 | Liaw et al. | |
| 6,486,056 B2 * | 11/2002 | Pasch et al. | 438/622 |
| 6,677,649 B2 | 1/2004 | Osada et al. | |
| 6,677,650 B2 | 1/2004 | Fischer et al. | |
| 6,699,726 B2 | 3/2004 | Hidaka et al. | |
| 2002/0090812 A1 * | 7/2002 | Chang | 438/637 |

* cited by examiner

Primary Examiner—Caridad Everhart
(74) Attorney, Agent, or Firm—Slater & Matsil, L.L.P.

(57) ABSTRACT

An SRAM cell includes six transistors. The storage nodes are implemented using local interconnects. A first level of metal overlies the interconnects but is electrically isolated therefrom. Contact plugs are formed to couple the cell to the first level of metal. The contact plugs are preferably formed in a different process step than the interconnects.

42 Claims, 15 Drawing Sheets

US 7,176,125 B2

METHOD OF FORMING A STATIC RANDOM ACCESS MEMORY WITH A BURIED LOCAL INTERCONNECT

This is a continuation-in-part of U.S. application Ser. No. 10/898,456, filed on Jul. 23, 2004 now abandoned, and incorporated herein by reference.

TECHNICAL FIELD

The present invention relates generally to semiconductor structures and methods and more particularly to a method of forming a structure, such as static random access memory, with a buried local interconnect.

BACKGROUND

Electronic devices, including mobile and portable devices such as cell phones, personal digital assistants (PDA), and digital cameras, use static random access memory (SRAM) chips with a high storage density. In deep submicron technology, a large number of SRAM cells are used in products such as microprocessors, communications chips and system on a chip (SOC) applications. One ongoing goal is to reduce the size of each cell in order to lower overall costs.

FIG. 1 shows a schematic diagram of a conventional six-transistor (6T) SRAM cell 10. In this cell, a first inverter includes p-channel transistor 12 coupled in series with n-channel transistor 14 and a second inverter includes p-channel transistor 16 coupled in series with n-channel transistor 18. For each transistor in the figure, the source, drain and gate is labeled with the reference number of the transistor followed by an "S," "D," or "G," respectively. The two inverters are cross-coupled so that the gates of transistors 12 and 14 are coupled to the source regions of transistors 16 and 18 (which make up the second storage node 26) and the gates of transistors 16 and 18 are coupled to the source regions of transistors 12 and 14 (which make up the first storage node 24). The drains of transistors 12 and 16 are coupled to a high supply voltage node (e.g., Vcc or Vdd) and the drains of transistors 14 and 18 are coupled to a low supply voltage node (e.g., Vss or ground).

Transistors 20 and 22 provide access to the cross-coupled inverters. Accordingly, the transistor 20 has a current path coupled between a first storage node, in this case, the source regions of transistors 12 and 14, and a bit line BL. The transistor 22 has a current path coupled between a second storage node, in this case, the source regions of transistors 16 and 18, and a complementary bit line BL/. The gates of the transistors 20 and 22 are coupled to wordlines WL and WL'. If the wordlines WL and WL' are not formed from a continuous level of conductive material, the cell is referred to as a split wordline (SWL) architecture. In any event, the wordlines WL and WL', and therefore the gates 20G and 22G, are coupled together functionally, e.g., in a separate level of metal.

During operation, data is written into the cell 10 by activating the wordline WL (and WL') to couple the first storage node 24 to the bitline BL and the second storage node 26 to the complementary bitline BL/. The value of the data carried on the bitline BL will be of the opposite value of the data carried on the complementary bitline BL/ and the cross-coupled inverters will latch that value. For example, if a logical "1" is applied to the first storage node 24, the inverter 12/14 will generate a logical "0" and apply that to the second storage node 26. At the same time, the inverter 16/18 will invert the logical "0" and apply a logical "1" to the first storage node 24. This state will be held until new data is applied through the access transistors 20 and 22 (or power is removed).

FIG. 2 shows a layout of an SRAM cell of the prior art. Each of the regions has been labeled to correspond to the schematic diagram of FIG. 1. In this implementation, the source regions 12S–22S and drain regions 12D–22D are implemented in heavily doped silicon and the gates 12G–22G are implemented in doped polysilicon. Metal is used for the interconnects WL, BL, Vss, Vcc, BL/ and WL'. Contacts between the silicon or polysilicon and overlying metal are indicated by the symbol showing a square with an "X" in it. In this architecture, the cell uses ten such contacts. The cell also makes use of three levels of metal (referred to as metal 1, metal 2, and metal 3, with metal 1 being closest to the silicon body and metal 3 being furthest from the silicon body). In one scheme the first metal layer is used as an intra-cell local interconnect (12S to 14S and 16S to 18S) and as landing pads (e.g., Vss, Vcc, WL and BL) and the second metal layer as the wordline conductor, and as landing pads (e.g., Vss, Vcc and BL). The third metal layer can be used for the bitline conducts (BL, BL/) and reference voltages (Vcc and Vss). In a second kind of layout scheme the first metal layer can be used for intra-cell local interconnects (12S to 14S and 16S to 18S) and landing pads (e.g., Vss, Vcc, WL and BL) and the second metal layer can be used for the bitline (BL and BL/) and one power supply (e.g., Vcc). The third metal layer can be used for the wordline and Vss conductor lines.

FIG. 3 shows another layout of an SRAM cell of the prior art. As before, each of the regions has been labeled to correspond to the schematic diagram of FIG. 1. The implementation of FIG. 3 differs from that of FIG. 2 in that the contact 28 between the polysilicon that forms gates 16G and 18G and the doped silicon that forms region 12S is a butted contact (as indicated by the rectangle with an "X" in it.) A butted contact 28' is also used between the polysilicon that forms gates 12G and 14G and the doped silicon that forms region 16S. Butted contacts are disclosed in U.S. Pat. No. 5,955,768, which is incorporated herein by reference. This implementation is advantageous over of the implementation of FIG. 2 since the number of contacts has been reduced from ten to eight (six contacts and two butted contacts).

SUMMARY OF THE INVENTION

The preferred embodiment of the present invention provides an even greater improvement by limiting the number of contacts between the cell (doped regions and polysilicon) and the metal to only four. The architecture further only utilizes two levels of metal (e.g., metal 1 and metal 2).

The preferred embodiment uses a buried local interconnect layer for SRAM cell design. In a conventional split wordline design, the standard routing uses a 1P3M (one polysilicon, three metal) process. The preferred embodiment cell includes an additional buried local interconnect (LI) so that the routing only uses a 1P2M (one polysilicon, two metal) process with one LI. The LI is formed by the plug layer only. This scheme is advantageous since the process cost and complexity of an LI layer is less than that of a metal layer, which typically includes one via, one line and a thicker intermetal dielectric (IMD) layer.

According to the preferred embodiment, the SRAM cell uses a minimum number of contact, metal and via layers. This LI also benefits the cell contact/metal routing rules and provides the smallest cell structure and minimum metal layers. The butted contact (e.g., rectangular contact, shared contact, longer contact) is a very popular technology that can reduce the contact space and number of contacts needed. But this process is difficult to implement (e.g., in the lithography and etch module) due to the inherent processing conflicts between a regular (square) contact and a butted (elongated) contact in the same layer. In the preferred embodiment, the buried LI is formed in a separate layer and located on SRAM only. This creates a stable environment (only dense pattern and dielectric layers) for these LI photolithography and etch steps.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5 and 6 are cross-sectional views of the SRAM cell of FIG. 4a;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
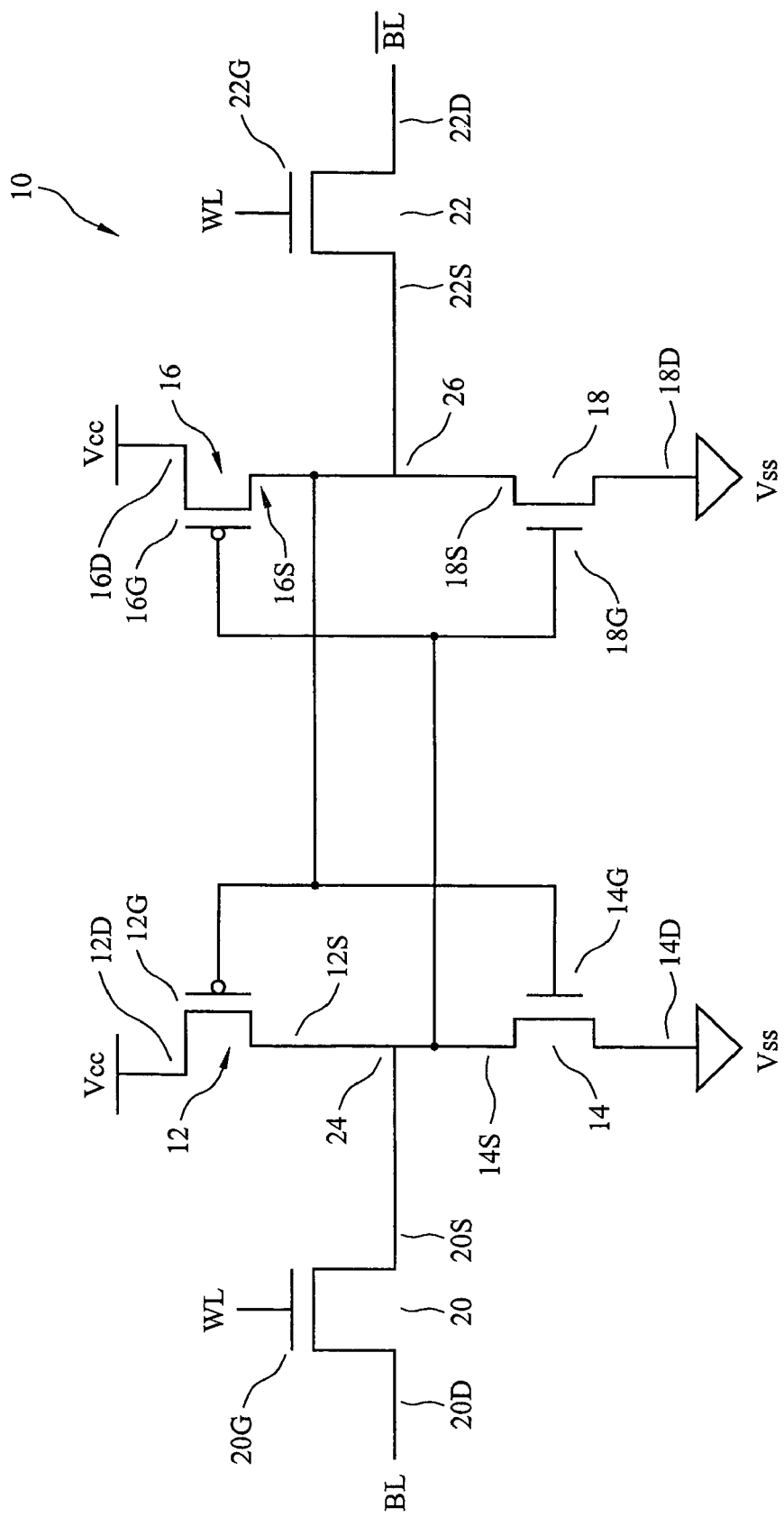
FIG. 1 is a schematic diagram of a 6T SRAM cell.
Figure 4A:
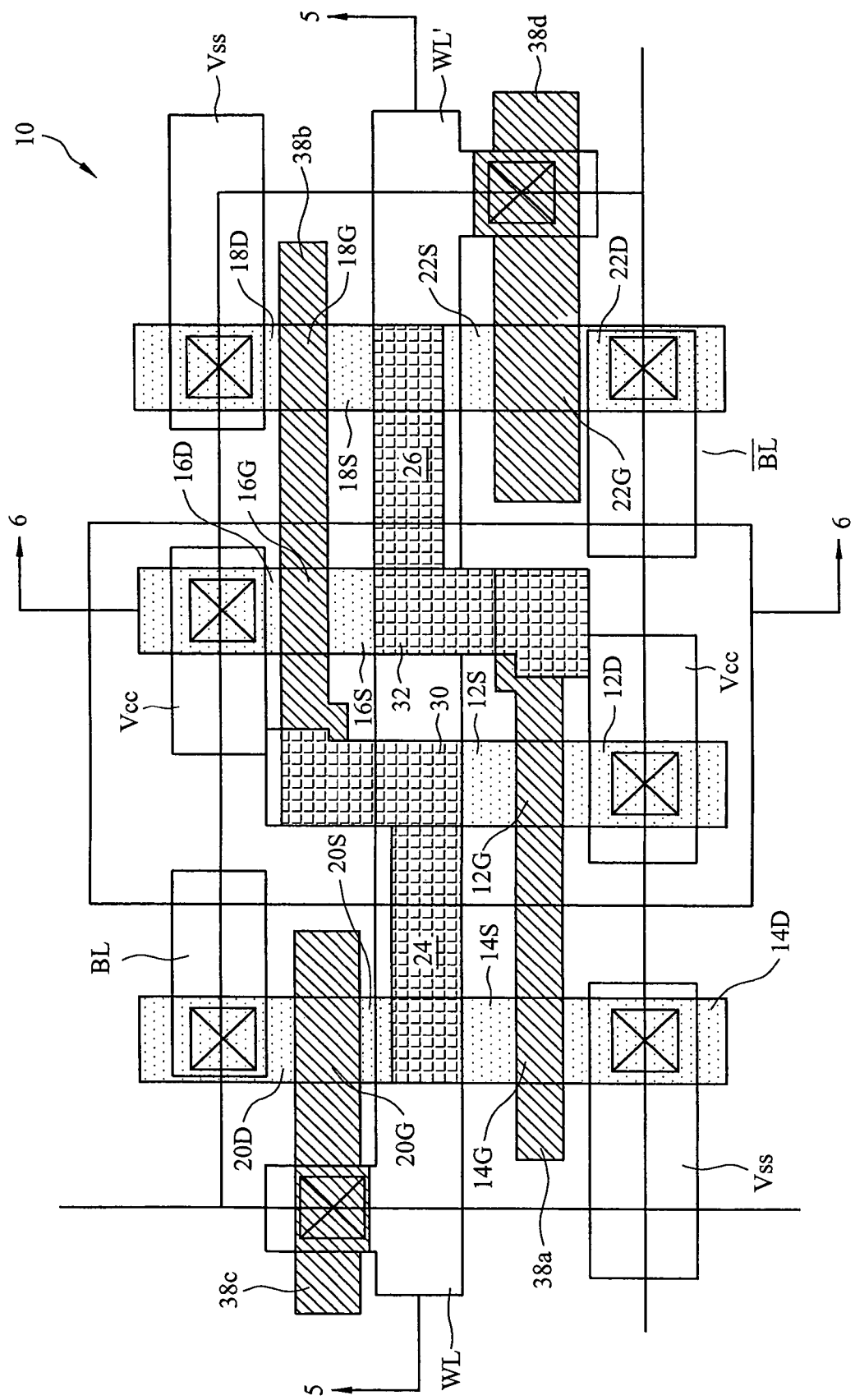
FIGS. 4a–4g are layouts of a first embodiment SRAM cell.

FIG. 4a shows the layout of a first embodiment SRAM cell of the present invention. The schematic diagram of the device is shown in FIG. 1 and, therefore, the various regions have been labeled to correspond with the labels used in FIG. 1.

As discussed above, the SRAM 10 of FIG. 4a includes six transistors. In particular, p-channel pull-up transistor 12 includes drain 12D coupled to a high voltage supply node Vcc (e.g., held at a voltage such as 1.5V, 2.4V or 3.3V) and a source 12S coupled to a first storage node 24. In another embodiment, the high voltage supply Vcc is held at a voltage between 0.5V and 1.5V. N-channel pull-down transistor 14 includes a drain 14D coupled to a low voltage supply node Vss (e.g., held at a voltage such as 0V, that is, ground or one bias voltage (0–0.5×Vdd) and a source 14S coupled to the first storage node 24. The gates 12G and 14G of the transistors 12 and 14 are electrically coupled together at a second storage node 26. In this case, the gates 12G and 14G are formed from the same physical region of doped polysilicon. The transistors 12 and 14 form a first inverter.

A second inverter is formed from transistors 16 and 18. P-channel pull-up transistor 16 includes a drain 16D coupled to the high voltage supply node Vcc, a source 16S coupled to the second storage node 26, and a gate 16G coupled to the first storage node 24. The second n-channel pull-down transistor 18 includes a drain 18D coupled to the low voltage supply node Vss, a source 18S coupled to the second storage node 26, and a gate 18G coupled to the first storage node 24. The second inverter 16/18 is cross-coupled with the first inverter 12/14.

Two-channel access transistors 20 and 22 are also included. While the preferred embodiment of the invention is directed to a 6T SRAM cell, a single-ended SRAM cell is also contemplated. In this case, one of the access transistors 20 or 22 would be eliminated, thereby creating a 5T cell. In other embodiments, the transistors 12–18 could be used to form any type of latch and other methods of access could be used. In other words, one or both of access transistors 20 and 22 are optional.

The first access transistor 20 includes a source 20S coupled to the first storage node 24, a drain 20D coupled to a first bitline BL and a gate 20G coupled to a wordline WL. The second access transistor 22 includes a source 22S coupled to the second storage node 26, a drain 22D coupled to a second bitline BU and a gate 22G coupled to the wordline WL. As discussed above, the wordline WL could be split into two physically separated conductors. One of the advantages of this embodiment, however, is that this is not necessary.

Advantageously, the embodiment of FIG. 4a utilizes local interconnects. In particular, a first local interconnect 30 electrically couples each of the elements of the first storage node 24 and a second local interconnect 32 electrically couples each of the elements of the second storage node 26. In this example, first local interconnect 30 electrically couples the source 12S of the pull-up transistor 12, the source 14S of the pull-down transistor 14, the gates 16G and 18G of the transistors 16 and 18, as well as the source 20S of access transistor 20. Similarly, second local interconnect 32 electrically couples the source 16S of the pull-up transistor 16, the source 18S of the pull-down transistor 18, the gates 12G and 14G of the transistors 12 and 14, as well as the source 22S of access transistor 22. Formation of the local interconnects 30 and 32 will be discussed in greater detail below.

Figure 4B:
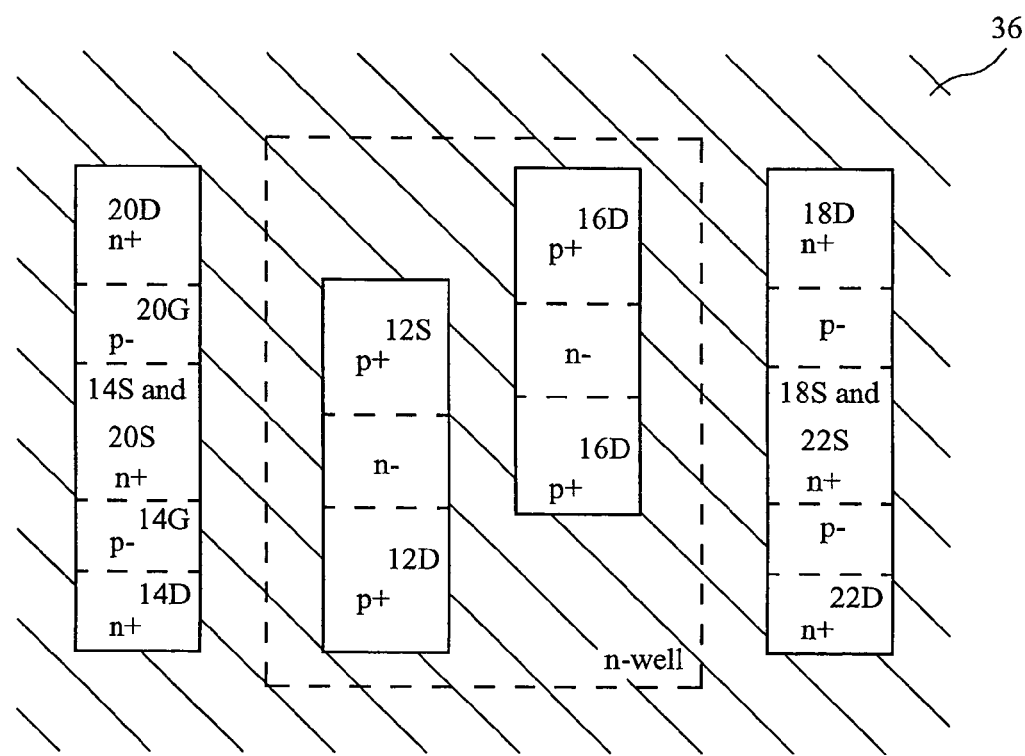

FIGS. 4b–4e are provided to aid in identifying the various regions in the plan view of FIG. 4a. These additional figures each show a subset of the levels of material that are illustrated in FIG. 4a. In particular, FIG. 4b shows the substrate, or more generally, semiconductor body, (labeled 34 in FIGS. 5 and 6). As shown in the figure, transistors 14 and 20 are formed in a first active area, transistor 12 in a second active area, transistor 16 in a third active area and transistors 18 and 22 in a fourth active area. The n-channel transistors 14, 18, 20 and 22 include sources and drains that are formed from heavily doped n-type semiconductor and channels (denoted with the suffix "C") of lightly doped p-type semiconductor. These active areas can be formed in a p-well or in the substrate 34. Similarly, the p-channel transistors 12 and 16 include sources and drains that are formed from heavily doped p-type semiconductor and channels of lightly doped n-type semiconductor. In the illustrated embodiment, these active areas are formed in an n-well.

The semiconductor body preferably comprises monocrystalline silicon. In other embodiments, substrates of silicon germanium, strained silicon, silicon on insulator, or composite silicon content can be used. The substrate can be a bulk-substrate or a non-bulk substrate.

Isolation regions 36 surround the active areas. In the preferred embodiment, the isolation is a shallow trench isolation (STI). Other isolation techniques, such as field oxide, could also be used.

Figure 4C:
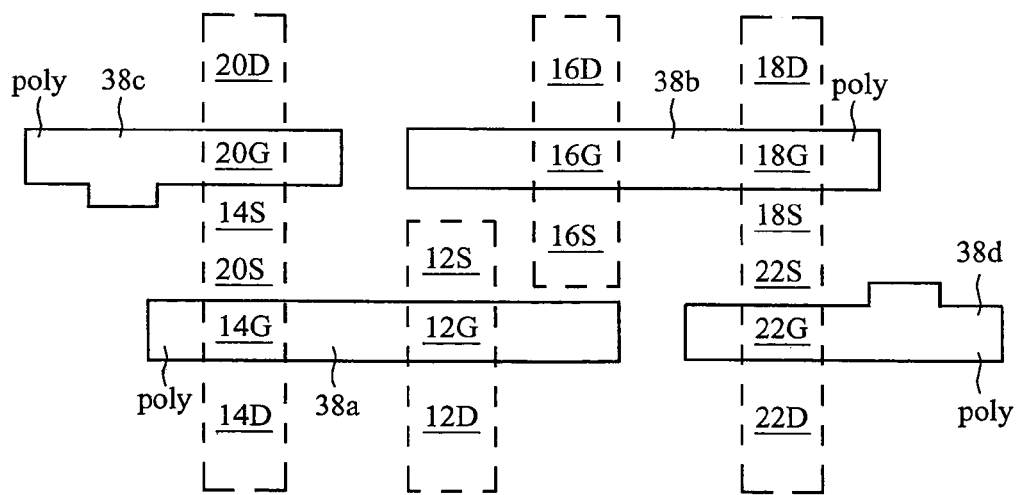

FIG. 4c shows the polysilicon layer overlying the active areas, which are illustrated with dotted lines. In this example, a single region 38a of polysilicon is used for the gates 12G 14G and another single region 38b of polysilicon is used for the gates 16G and 18G. Polysilicon regions 38c and 38d are also provided for gates 20G and 22G. While a single region of polysilicon could be used for these gates 20G and 22G, separate regions are used to minimize the amount of area needed. In the preferred embodiment, only a single layer of polysilicon is used. In other words, all of the polysilicon shown in FIG. 4c was deposited at the same time and later etched to create the desired regions.

Figure 4D:
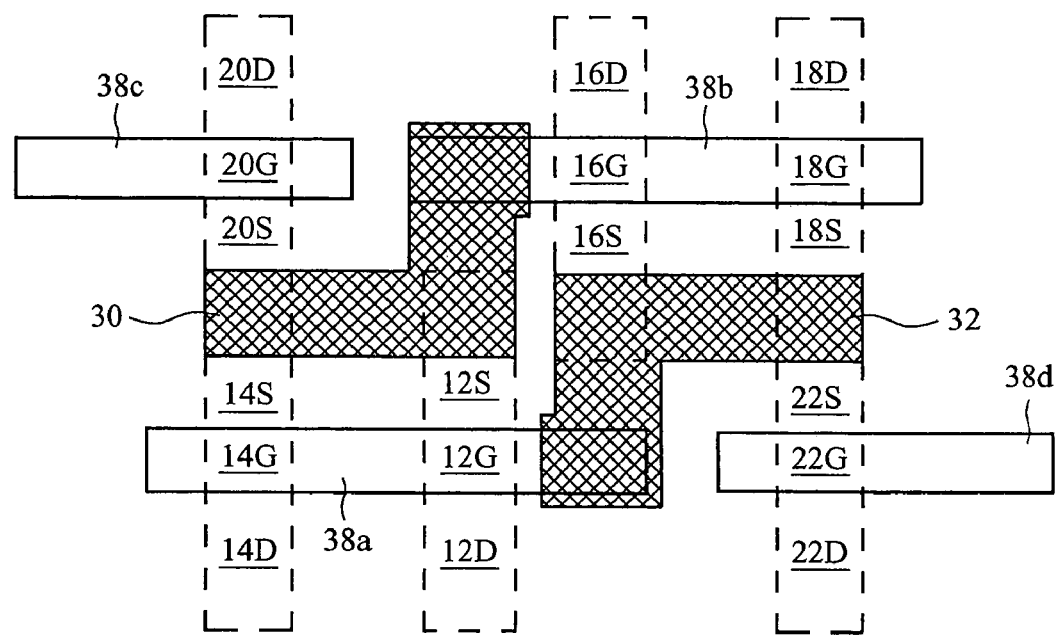

FIG. 4d shows the local interconnect regions 30 and 32. As shown, local interconnect region 30 is electrically coupled to the shared doped region 14S/20S and also to the polysilicon region 38b. Similarly, local interconnect region 32 is electrically coupled to the shared doped region 18S/22S and also to the polysilicon region 38a. For reference, the active areas and polysilicon regions are also shown in this figure.

Figure 4E:
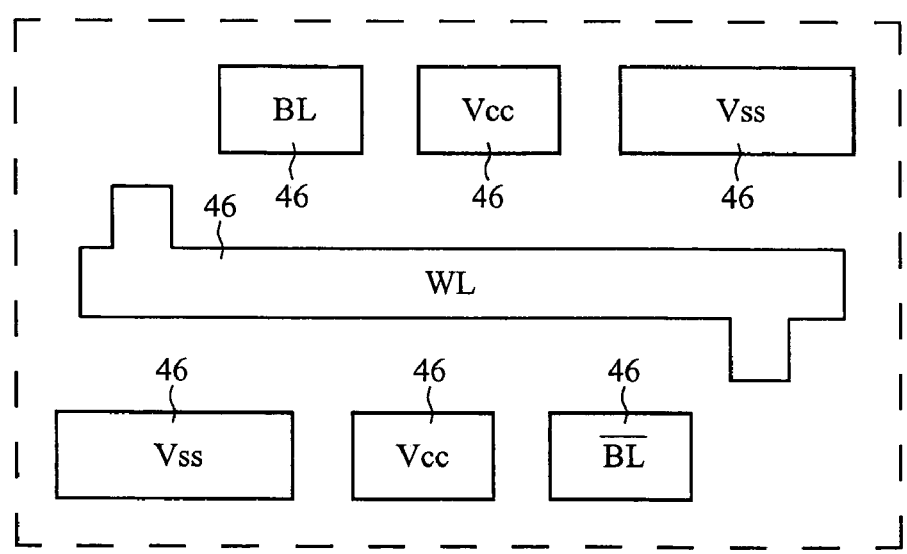

FIG. 4e shows the first metal layer 46. Each of the regions of metal 46 has been labeled to correspond with the functional use of that conductor. While no other levels are shown in this figure, reference can be made to FIG. 4a to see how the metal regions lay out relative to the other materials. In the preferred embodiment, each of the metal regions shown is formed from a single level of metal. In other embodiments, multiple levels of metal could be used.

Figure 4F:
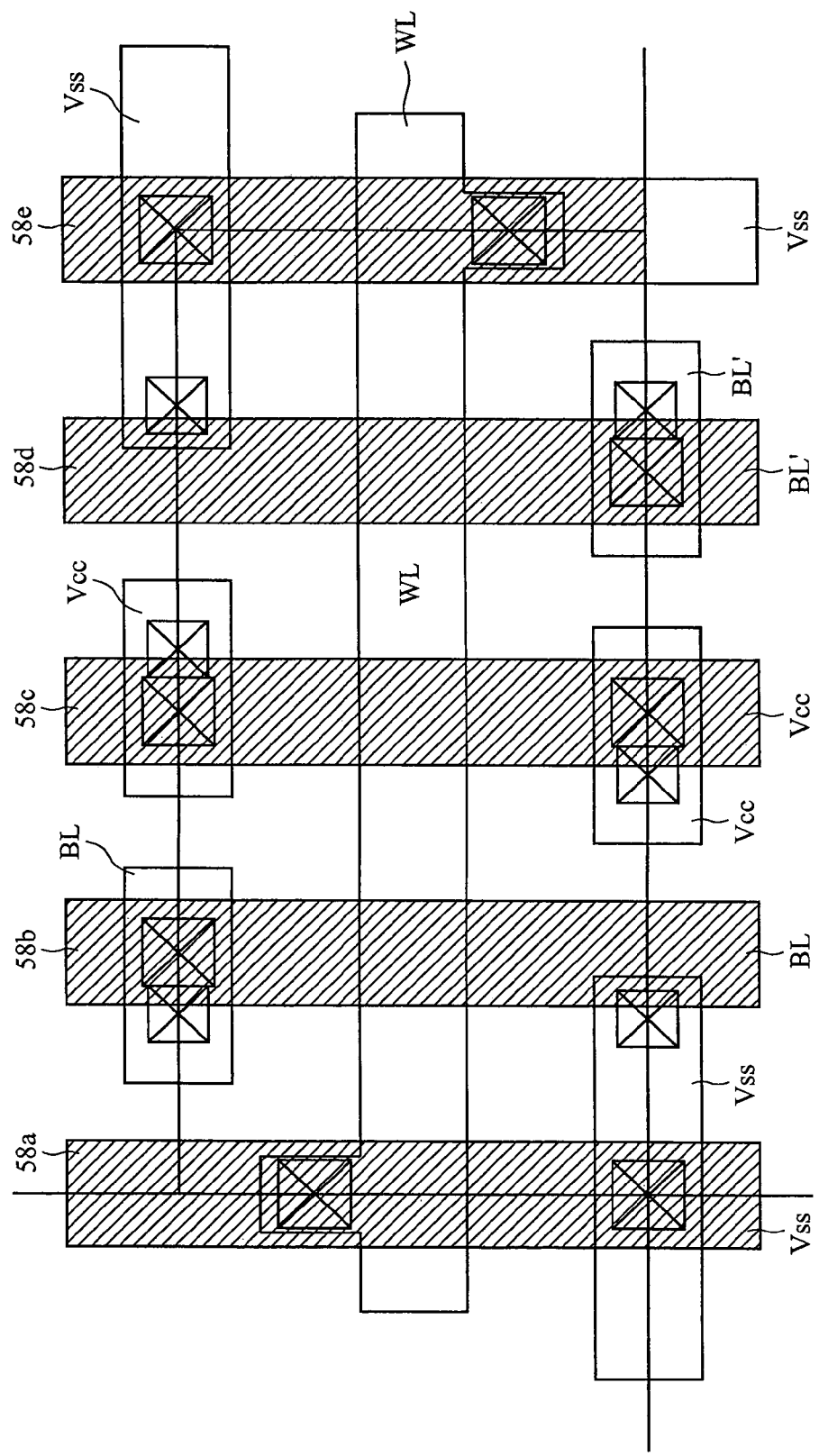

FIG. 4f shows the second metal layer 58. In this embodiment, the portions 58a and 58e of metal 2 are used as Vss strap lines. In other words, these regions electrically: couple the metal regions 46 labeled Vss in FIG. 4e with the low supply voltage. Similarly, the portion 58c of the second metal is used as a Vcc strap line. Finally, the portions 58b and 58d are used as the bitline BL and complementary bitline BL/, respectively.

Figure 4G:
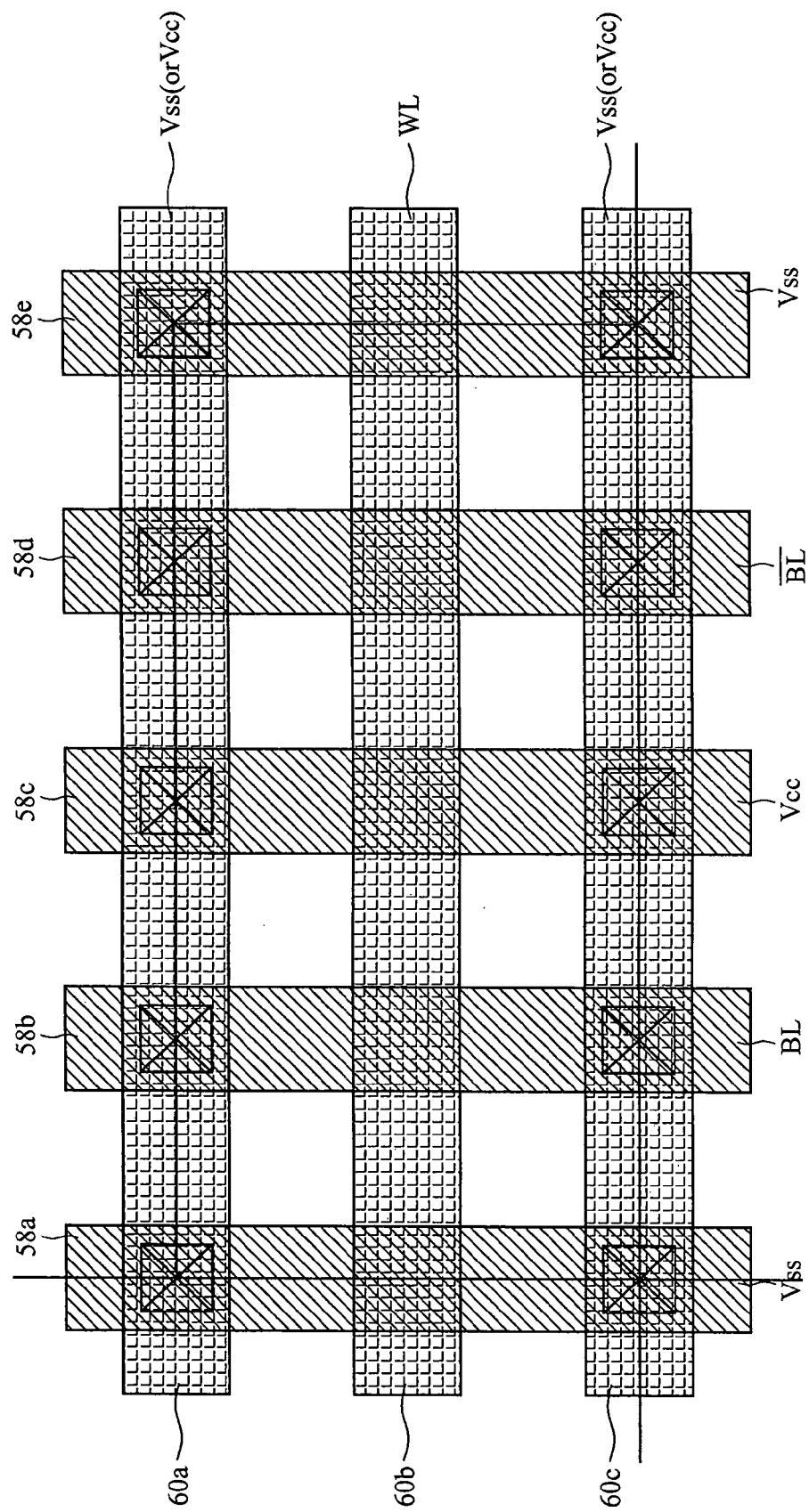

FIG. 4g shows the third metal layer 60. In this embodiment, the portion 60b of the third metal layer is used as a global wordline, that is, a wordline that is electrically coupled to a number of SRAM cells. The portions 60a and 60c can be used for coupling the cell to power supply voltages (either Vss or Vcc, depending upon the specific implementation). In other implementations, any of the metal 3 lines can be used for interconnections not needed by SRAM cell 10. In any case, no intercell routing is needed for metal 3.

Figure 5:
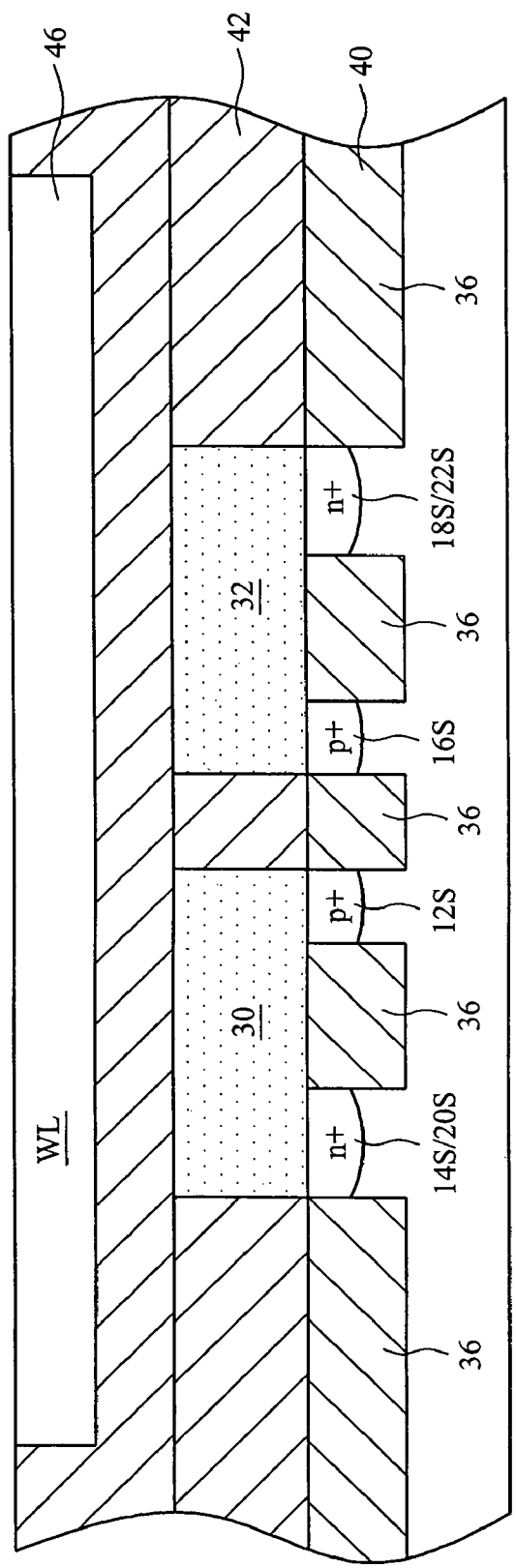
Figure 6:
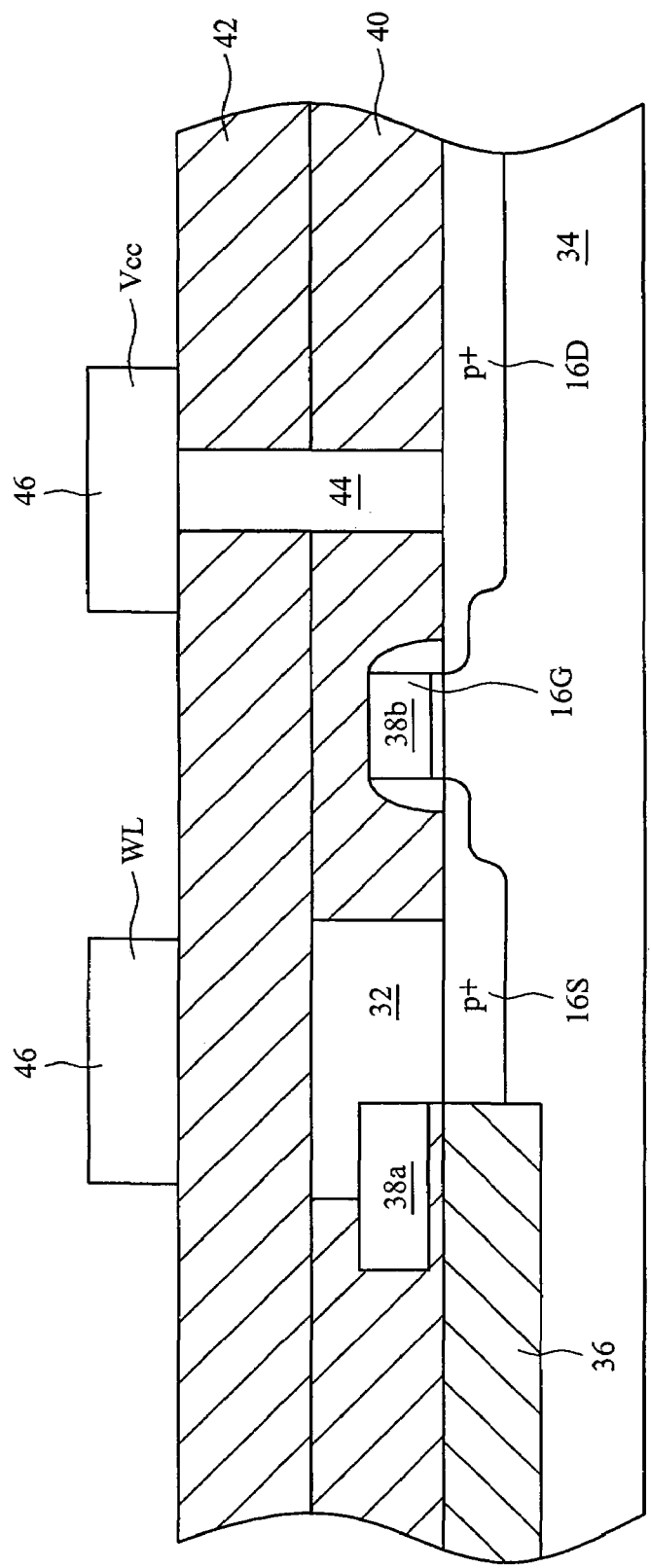

FIGS. 5 and 6 illustrate cross-sectional views of the SRAM cell 10 in the areas noted in FIG. 4a. FIG. 5 shows how the local interconnect 30 electrically couples the doped regions 14S/20S to the source region 12S and how the local interconnect 32 electrically couples the doped regions 18S/22S to the source region 16S. FIG. 6 shows how local interconnect 32 couples source region 16S to polysilicon 38a. While not shown, local interconnect 30 makes a similar electrical connection between source region 12S and polysilicon region 38b.

As shown in both of the figures, a first dielectric layer 40 is formed over each of the transistors 12–22. The local interconnects 30 and 32 are formed within and substantially co-planar with the first dielectric layer 40. A second dielectric layer 42 is then formed over the first dielectric layer 40 and the local interconnects 30 and 32. In the preferred embodiment, the first dielectric layer 40 has a thickness of between about 100 nm and 400 nm, preferably less than 250 nm, and the second dielectric layer 42 has a thickness of greater than about 20 nm, preferably between about 50 nm and 300 nm.

FIG. 6 also shows an example of one of the contact plugs 44. This contact plug extends through the first dielectric layer 40 and the second dielectric layer 42 in order to electrically couple the drain 16D of the pull-up transistor 16 with the first level of metal (at a region held at the high supply voltage level Vcc). In the preferred embodiment, the contact plug 44 is formed from a conductor that extends through both dielectric layers 40 and 42.

Figure 2:
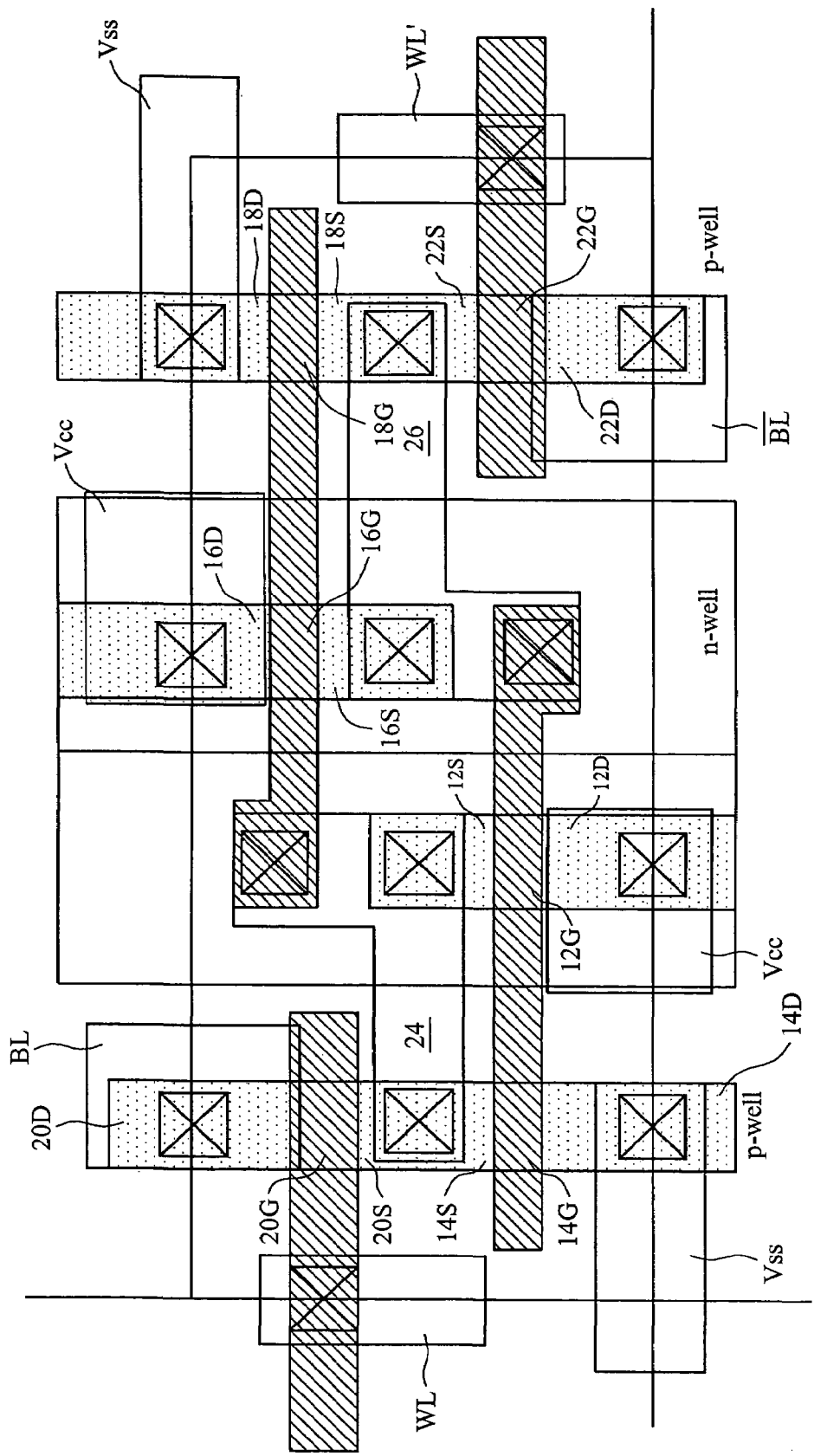
FIGS. 2 and 3 are layouts of conventional SRAM cells.
Figure 3:
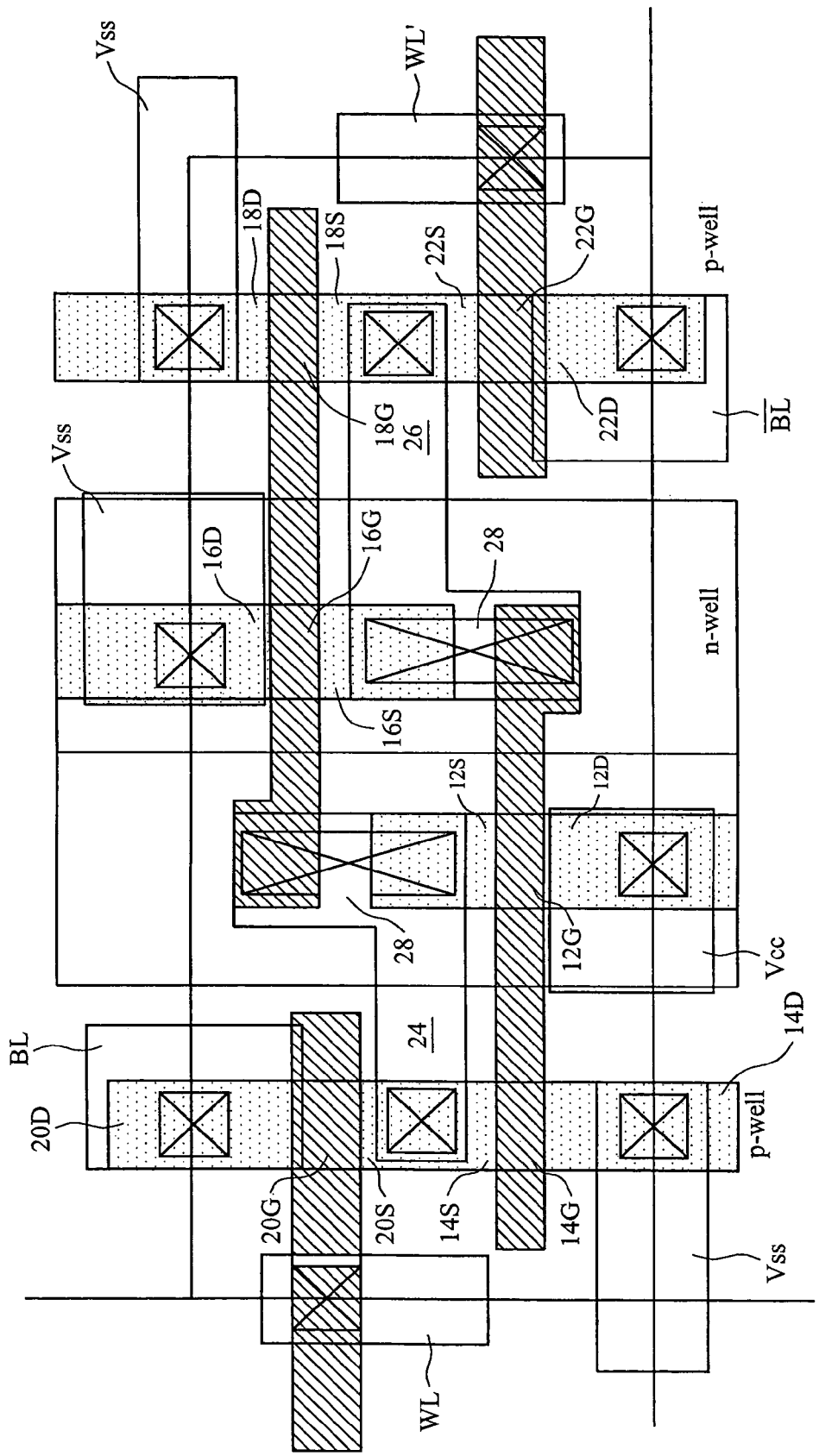

Table 1 shows some of the features of the preferred embodiment of the present invention compared to the prior art embodiments of FIGS. 2 and 3.

TABLE 1

|  | Scheme of FIG. 2 (Prior art) | Scheme of FIG. 3 (Prior art) | Scheme of FIG. 4a (Preferred embodiment) |
| --- | --- | --- | --- |
| Buried local interconnect | none | none | two (for internal cell charge node connection) |
| Contacts to cell | ten | eight (two are butted) | four (for Vcc, Vss, bitline and wordline) |
| Metal 1 | used for landing pads and intra cell connection | used for landing pads and intra cell connection | used for wordline strap and landing pads |
| Via 1 | four | four | three (for Vcc, Vss, and bitline) |
| Metal 2 | used for wordline | used for wordline | used for Vcc, Vss, bitline and bitline bar |
| Via 2 | three | three | none |
| Metal 3 | used for Vcc, Vss, bitline and bitline bar | used for Vcc, Vss, bitline and bitline bar | none |

Figure 7A:
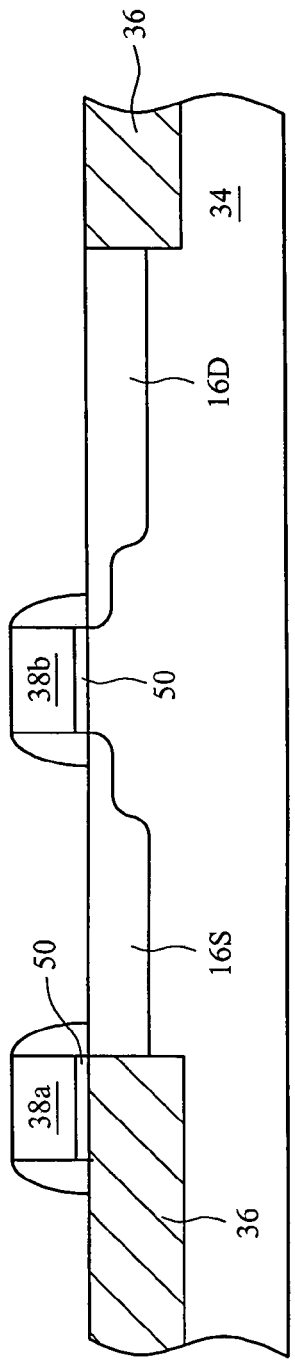
FIGS. 7a–7e are cross-sectional views of an exemplary semiconductor device during various stages of manufacture.

FIGS. 7a–7e show a preferred embodiment method of fabricating a device of the present invention. Each of these figures shows the same cross-sectional view as in FIG. 6. Referring first to FIG. 7a, transistor devices 12–22 have all been formed using standard processing. For example, STI regions 36 are formed by etching the shallow trenches and filling them with dielectric. Gate dielectric layer 50 and polysilicon layer 38 are then deposited. The polysilicon layer 38 is then patterned to form polysilicon regions 38a–38d, thereby forming gates 12G–22G. The lightly doped portions of the source/drain regions (e.g., 16S, 16D) are then formed followed by formation of the sidewall spacers 52 (e.g., oxide, nitride and/or oxynitride). The heavily doped portions of the sources and drains (e.g., 16S, 16D) can then be formed.

Figure 7B:
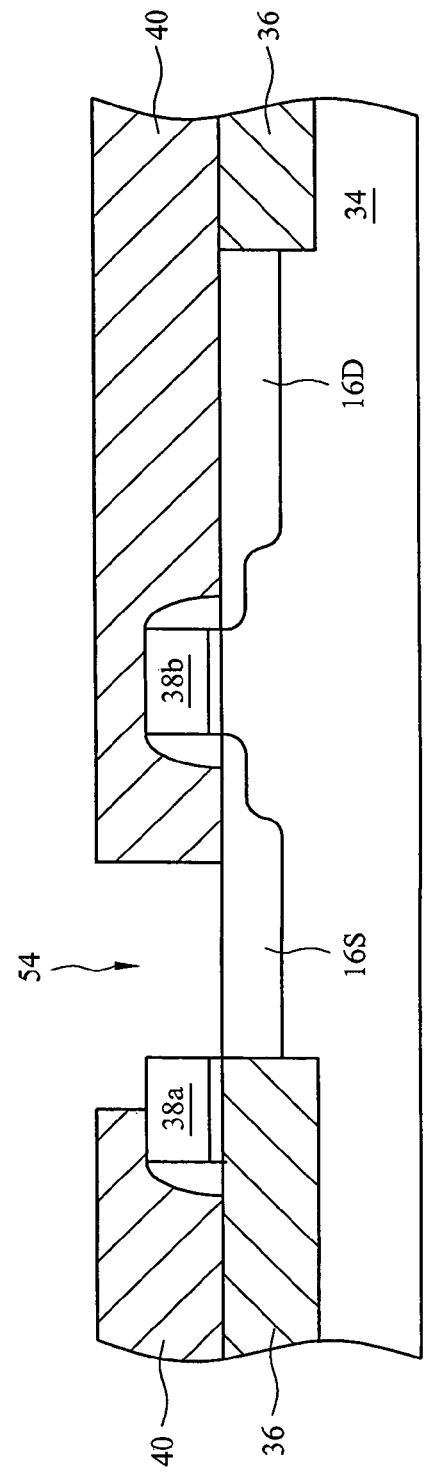

Referring now to FIG. 7b, first dielectric layer 40 is formed over the device, including the transistors 12–22. The first dielectric layer 40 preferably comprises an oxide such as a silicon oxide that is formed by high density plasma (HDP) oxide or the decomposition of tetraoxyethylsilane (TEOS), sometimes referred to as a TEOS layer. Other oxide layers such as those formed by silane chemical vapor deposition (CVD) or high temperature oxide (HTO) could alternatively be used. The dielectric layer 40 can be doped, e.g., borophosphosilicate glass (BPSG, e.g., BPTEOS) or phosphosilicate glass (PSG, e.g., PTEOS), as examples. In other embodiments, other materials such as silicon nitride (e.g., $Si_3N_4$), silicon oxynitride, silane based oxide (e.g., PEOX), or others could be used. Low-k dielectric materials can also be used.

After formation of the first dielectric 40, trenches 54 can be formed in the pattern of the local interconnects 30 and 32. This trench formation is also shown in FIG. 7b. In the preferred embodiment, local interconnect pattern has at least one feature with a width of less than 90 nm.

Figure 7C:
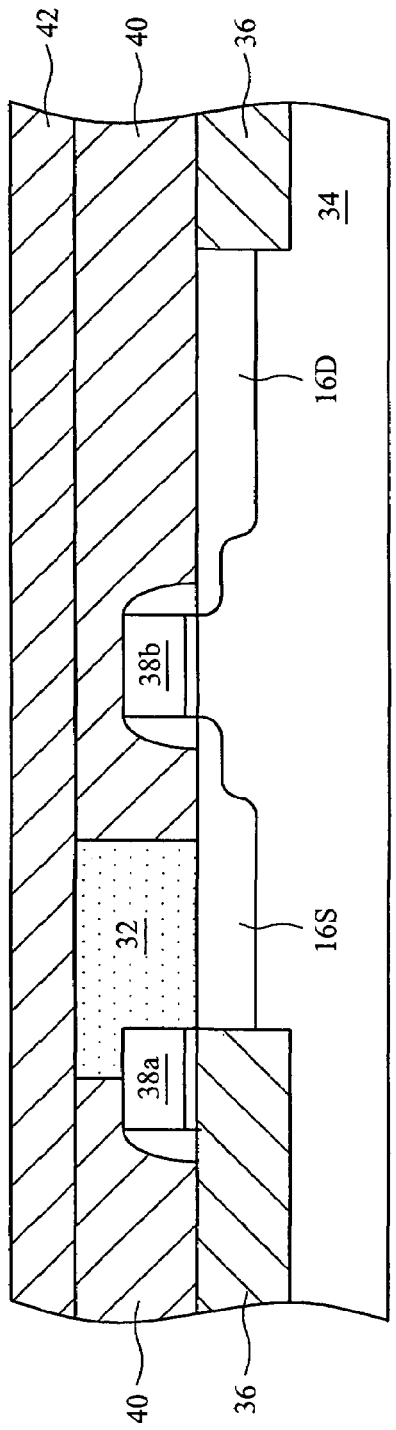

Referring now to FIG. 7c, the trenches 54 are filled with a conductive layer. In the preferred embodiment, the trenches are lined with a liner (e.g., titanium and titanium nitride) and filled with a conductor (e.g., tungsten). The conductor 32 can then be etched back or planarized (e.g., by chemical mechanical polish) so as to have a top surface that is substantially co-planar with a top surface of the first dielectric 40. In an alternate embodiment, the conductor 32 (and 30) can be chosen from Al, TiW, Co, Ni, Cu, AlCu, TiN, TaN, Ti, Co, Ni, silicide or other nitrided metal or combinations thereof.

FIG. 7c also shows the formation of the second dielectric layer 42. Preferably dielectric layer 42 comprises a TEOS oxide layer. Alternatively, the dielectric layer 42 can be another type of oxide, a nitride or an oxynitride layer or any of the materials listed with respect to layer 40. This layer could also be a low-k dielectric layer, e.g., with a dielectric constant less than 3.7, or preferably less than 3.0. Preferably, dielectric layers 40 and 42 are formed from the same material but this limitation is not necessary.

Figure 7D:
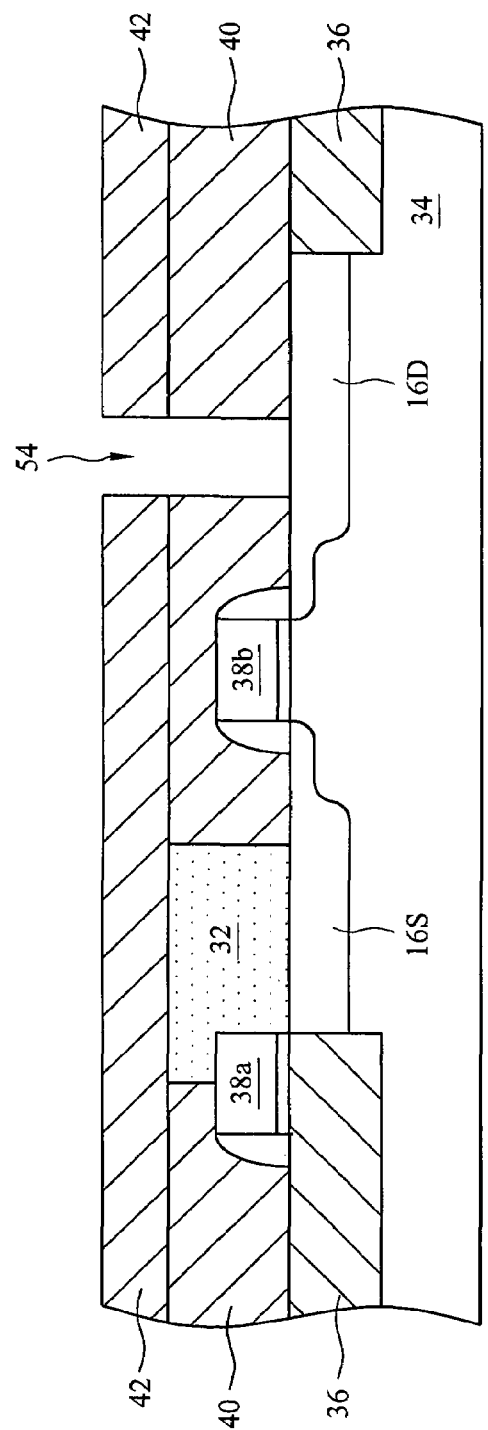

FIG. 7d shows a contact hole or via 54 that is formed through both dielectric layers 40 and 42. Forming the contact hole 54 in a separate step from the local/interconnect trench 54 is advantageous since each of the contact holes is of substantially the same size. This feature simplifies the lithography and etch steps. In the preferred embodiment, the etch can be performed using etchant gases such as $C_4F_8$, $C_5F_8$, $CH_2F_2$, $N_2$, and Ar.

Figure 7E:
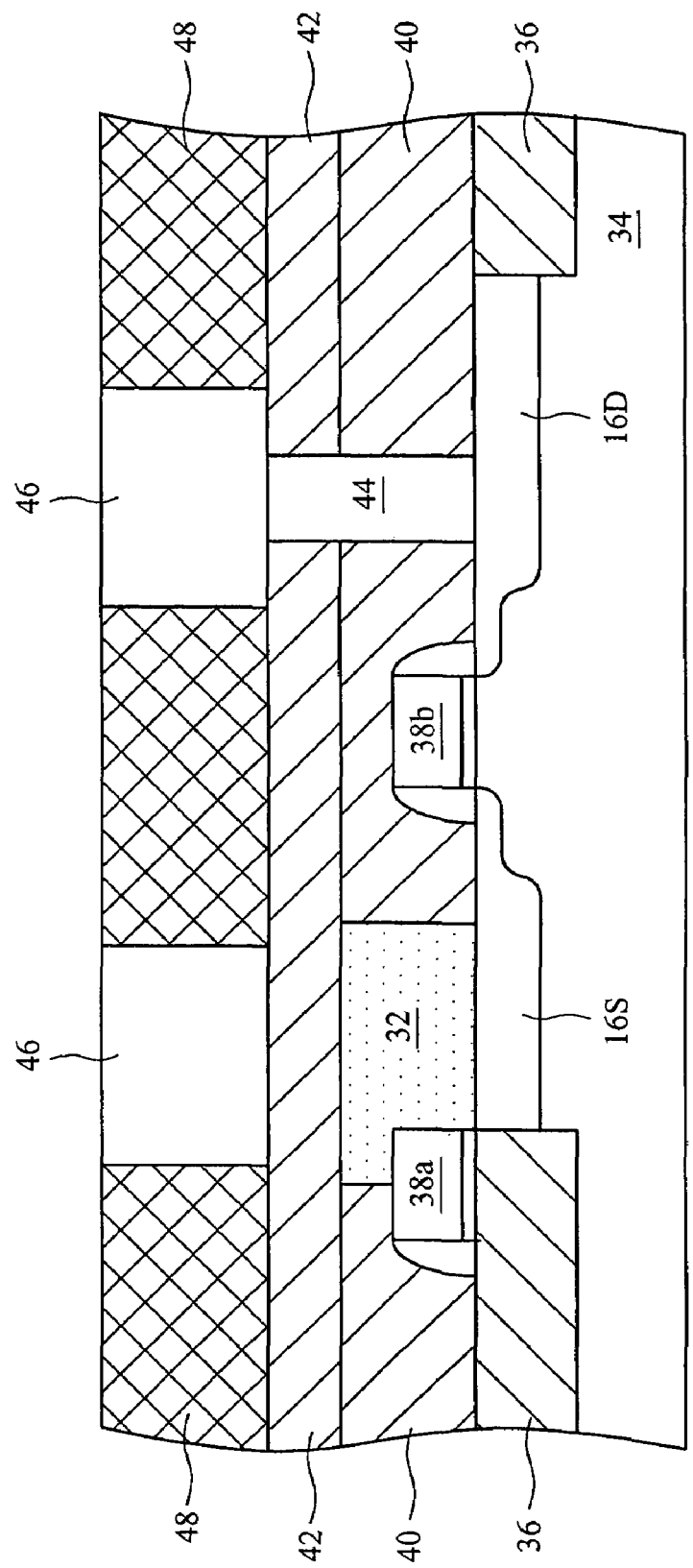

Finally, referring to FIG. 7e, the vias 54 are filled with conductive material to form the plug 44. In the preferred embodiment, the via holes 54 are lined with a liner (e.g., titanium and titanium nitride) and filled with a conductor (e.g., tungsten). The conductor 44 can then be etched back or planarized (e.g., by chemical mechanical polish) so as to have a top surface that is substantially co-planar with a top surface of the second dielectric 42. In alternate embodiment, the conductor 44 can be chosen from Cu, AlCu, TiN, TaN, Ti, or combinations thereof. Other conductors, such as Al, silicide, TiW, Co, or Ni, can also be used. Note that the local interconnects have already been formed at this point.

In the preferred embodiment, the via hole 54 was formed in a single mask step and the tungsten of the plug 44 has a continuous surface through the interface between dielectrics 40 and 42. The use of a single mask step avoids issues relating to the alignment of holes in the first second dielectric layers 40 and 42. Further, the use of a continuous conductor 44 avoids any contact resistance that may be created when two separate conductors are coupled together.

FIG. 7e also illustrates the formation of the first level of metal 46. In this example, a single damascene process is used. For example, a dielectric layer 48 is deposited over second dielectric layer 42 and plugs 44. The dielectric layer 48 is preferably a low-k dielectric (e.g., with a dielectric constant of less than 3.7, where the dielectric constant of a vacuum is 1.0). Examples of suitable low-k dielectrics include fluorinated silica glass (FSG), PETEOX and organic dielectrics such as SiLK™ and Black Diamond™ and carbon content dielectric and porous structure dielectric. Dual damascene processing, where the metal layer 46 and contact plus 44 are formed together, can also be used.

Trenches are formed within the dielectric layer 48 and filled with conductive material, preferably metal. In the preferred embodiment, the conductor of the first metal layer 46 is copper or aluminum copper. In other embodiments, the conductor may also comprise a material such as aluminum, titanium nitride, tantalum nitride, tungsten, titanium or combinations thereof. Other conductors could also be used.

Figure 8:
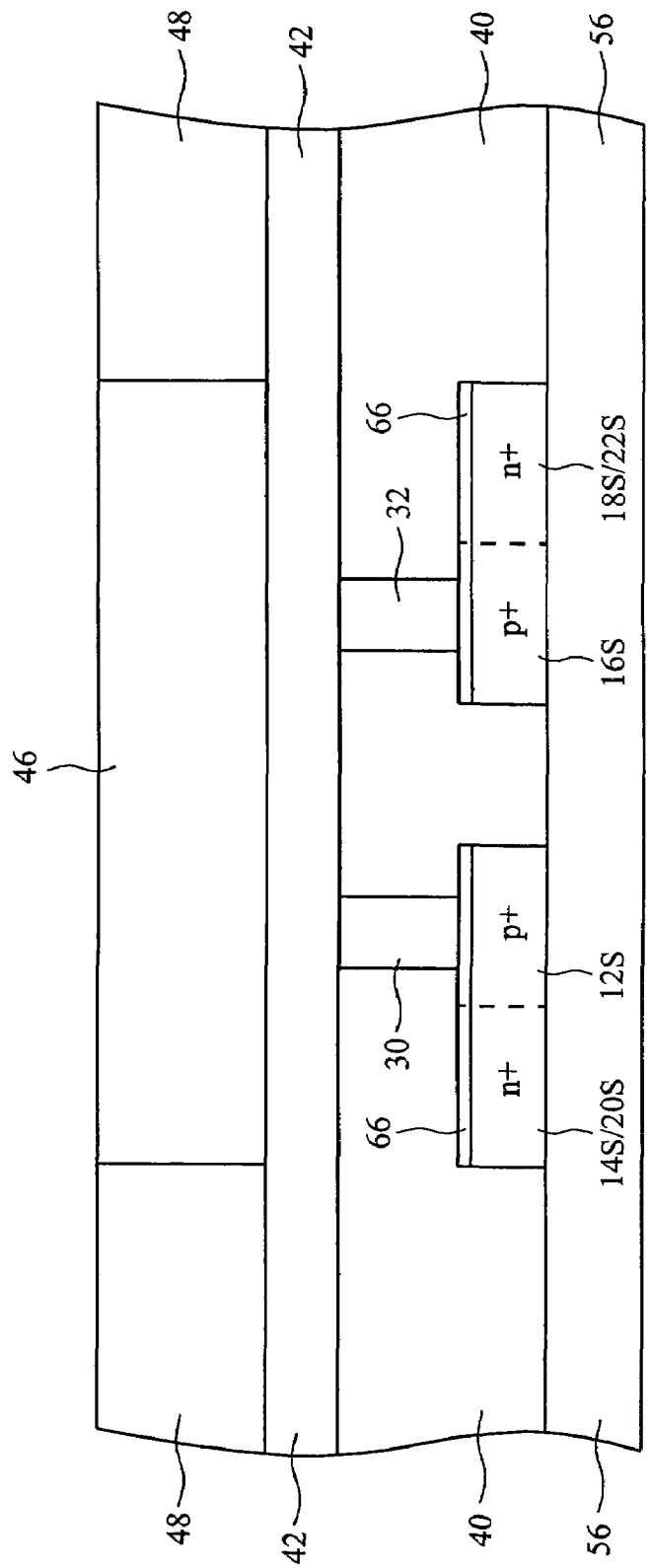
FIG. 8 is a cross-sectional view of an alternate embodiment.

An alternate embodiment is shown in FIG. 8, which shows a cross-sectional view of the same region depicted in FIG. 5. In this embodiment, the SRAM cell is formed on an SOI (silicon on insulator) substrate. Accordingly, the semiconductor body 34 is disposed over a buried insulator, e.g., a buried oxide 56. This embodiment also includes local interconnects 30 and 32 that are formed within first dielectric layer 40 beneath second dielectric layer 42.

Figure 9:
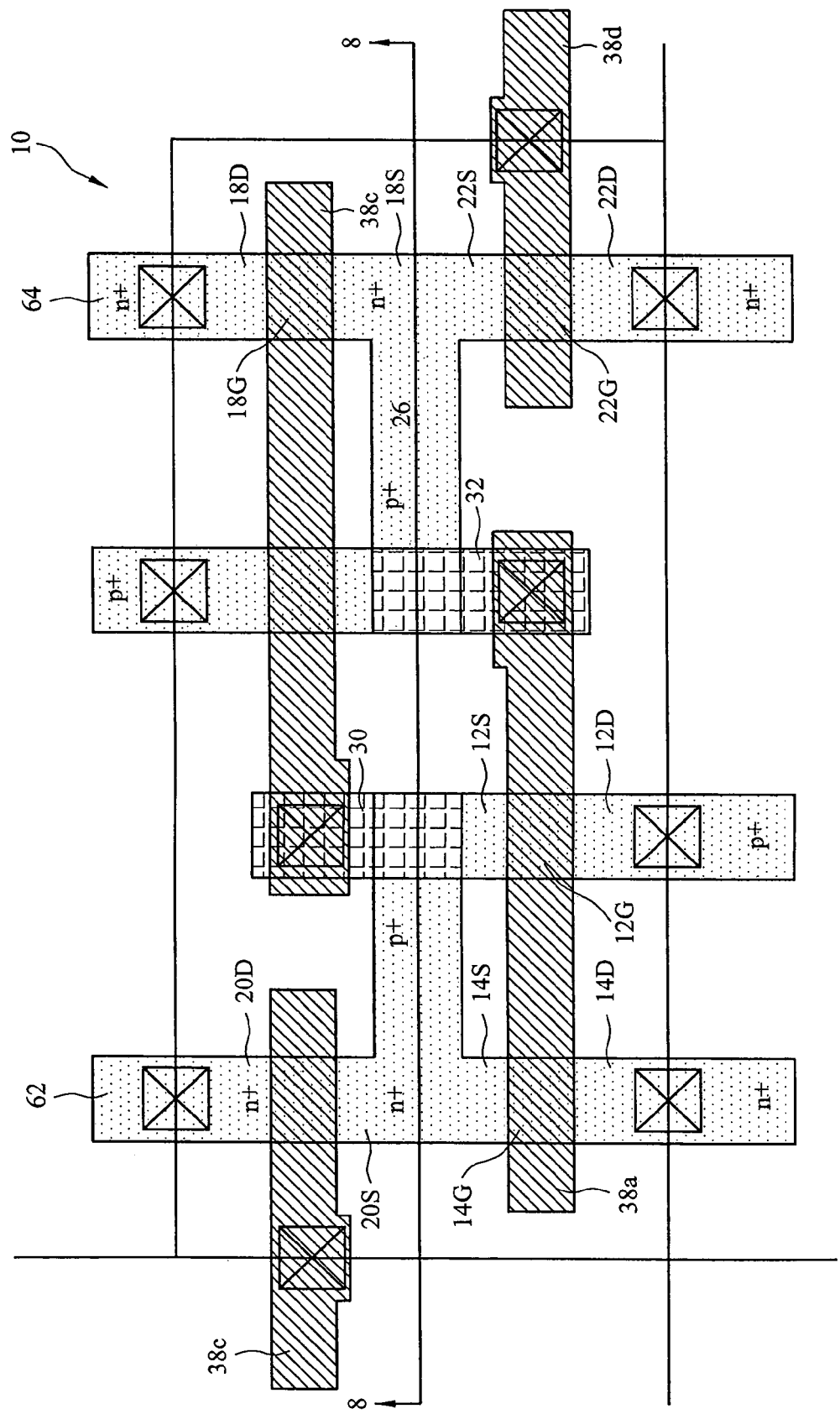
FIG. 9 is an example of a layout that can utilize the structure of FIG. 8.

FIG. 9 shows an exemplary layout of the embodiment of FIG. 8. In this example, the SRAM cell 10 is implemented using two semiconductor islands 62 and 64. One of the inverters and an access transistor is formed in a first of the islands 62 and the other inverter and access transistor is formed in the second island 64. The local interconnect 30 (32) is used to couple the storage node 24 (26) at source region 12S (16S) to the inverter input 38b (38a).

Referring to the specific implementation of FIG. 9, first semiconductor island 62 and second semiconductor island 64 are formed over the insulating layer 56 (FIG. 8). A first n-channel transistor 20 and a second n-channel transistor 14 are formed in the first semiconductor island 62. The transistors 14 and 18 share n-doped region 14S/18S. A first p-channel transistor 12 is also formed in the first semiconductor island 62. The first p-channel transistor 12 includes a p-doped region 12S that abuts the shared n-doped region 14S/18S. As shown in FIG. 8, a silicide region overlies the interface between the p-doped region 12S and the shared n-doped region 14S/18S. As in the earlier embodiments, a first polysilicon region 38c is used as a gate 20G of the first n-channel transistor 20 and a second polysilicon region 38a is used as a shared gate 12G/14G of the p-channel transistor 12 and the n-channel transistor 14. A similar configuration is found in the second semiconductor island 62.

Referring now to FIGS. 8 and 9 together, a first dielectric layer 40 is formed over the transistors 12–22 of the integrated circuit. A first local interconnect 30, which may be a butted contact, electrically couples the p-doped region 12S and the polysilicon region 38b. Preferably, the first local interconnect 30 is formed within and substantially co-planar with the first dielectric layer 40. Similarly, a second local interconnect 32 electrically couples the p-doped region 16S and the polysilicon region 38a. The second local interconnect 32 is also preferably formed within and substantially co-planar with the first dielectric layer 40.

A second dielectric layer 42 is disposed over the first dielectric layer 40, the first local interconnect 30 and the second local interconnect 32. A number of contact plugs (each indicated by a square with an "X") extend through the first and second dielectric layers 40 and 42 and electrically contact various ones of the doped regions and polysilicon regions. As discussed above, additional levels of metal can be included to form the desired interconnections.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
    a first p-channel pull-up transistor including a drain coupled to a high voltage supply node, a source coupled to a first storage node, and a gate coupled to a second storage node;
    a first n-channel pull-down transistor including a drain coupled to a low voltage supply node, a source coupled to the first storage node, and a gate coupled to the second storage node;
    a second p-channel pull-up transistor including a drain coupled to the high voltage supply node, a source coupled to the second storage node, and a gate coupled to the first storage node;
    a second n-channel pull-down transistor including a drain coupled to the low voltage supply node, a source coupled to the second storage node, and a gate coupled to the first storage node;
    a first dielectric layer formed over the first pull-up transistor, the first pull-down transistor, the second pull-up transistor and the second pull-down transistor;
    a first local interconnect electrically coupling the source of the first pull-up transistor, the source of the first pull-down transistor, the gate of the second pull-up transistor and the gate of the second pull-down transistor, the first local interconnect formed within and substantially co-planar with the first dielectric layer;
    a second local interconnect electrically coupling the source of the second pull-up transistor, the source of the second pull-down transistor, the gate of the first pull-up transistor and the gate of the first pull-down transistor, the second local interconnect formed within and substantially co-planar with the first dielectric layer;
    a second dielectric layer formed over the first dielectric layer, the first local interconnect and the second local interconnect;
    a first metal region formed over the second dielectric layer, the first metal region being held a voltage level of the high voltage supply node;
    a first contact plug extending through the first dielectric layer and the second dielectric layer and coupled between the drain of the first pull-up transistor and the first metal region;
    a second metal region formed over the second dielectric layer, the second metal region being held the voltage level of the high voltage supply node; and
    a second contact plug extending through the first dielectric layer and the second dielectric layer and coupled between the drain of the second pull-up transistor and the second metal region.

2. The integrated circuit of claim 1 and further comprising:
    a first access transistor including a first source/drain region coupled to the first storage node, a second source/drain region coupled to a bitline and a gate coupled to a wordline; and
    a second access transistor including a first source/drain region coupled to the second storage node, a second source/drain region coupled to a complementary bitline and a gate coupled to the wordline.

3. The integrated circuit of claim 2 wherein the wordline comprises a split wordline.

4. The integrated circuit of claim 2 wherein the first access transistor comprises an n-channel transistor and the second access transistor comprises an n-channel transistor.

5. The integrated circuit of claim 1 wherein the first local interconnect comprises tungsten and the second local interconnect comprises tungsten.

6. The integrated circuit of claim 1 wherein the first local interconnect comprises at least one material selected from the group consisting of a group from Cu, AlCu, TiN, TaN, Ti, Co, Ni, W and combinations thereof and wherein the second local interconnect comprises the material of the first local interconnect.

7. The integrated circuit of claim 1 wherein the first dielectric layer comprises a doped oxide layer.

8. The integrated circuit of claim 1 wherein the first dielectric layer comprises at least one material selected from the group consisting of PEOX, TEOS, BPTEOS, PSG, HDP oxide, Si3N4, and SiON.

9. The integrated circuit of claim 8 wherein the second dielectric layer comprises the material of the first dielectric layer.

10. The integrated circuit of claim 1 wherein the first dielectric layer has a thickness of between 100 nm and 400 nm and wherein the second dielectric layer has a thickness of greater than 20 nm.

11. The integrated circuit of claim 1 wherein the second dielectric layer comprises a low-k dielectric with a dielectric constant of less than 3.

12. The integrated circuit of claim 1 wherein the first metal region and the second metal region are both formed from a first level of metal.

13. The integrated circuit of claim 11 and further comprising a second level of metal, the second level of metal comprising copper.

14. The integrated circuit of claim 11 and further comprising a second level of metal, the second level of metal including a bitline conductor, a complementary bitline conductor, a Vss conductor and a Vcc conductor.

15. An integrated circuit device formed on an SOI substrate, the integrated circuit device comprising:
    an insulating layer formed over a substrate;
    a first semiconductor island formed over the insulating layer;
    a first n-channel transistor formed in the first semiconductor island;
    a second n-channel transistor formed in the first semiconductor island, the second n-channel transistor including an n-doped region that is shared with the first n-channel transistor;
    a first p-channel transistor formed in the first semiconductor island, the first p-channel transistor including a p-doped region that abuts the shared n-doped region of the first and second n-channel transistors;
    a first silicide region overlying an interface between the p-doped region of the first p-channel transistor and the shared p-doped region of the first and second n-channel transistors;
    a first polysilicon region for use as a gate of the first n-channel transistor;

a second polysilicon region for use as a shared gate of the first p-channel transistor and the second n-channel transistor;
a second semiconductor island formed over the insulating layer;
a third n-channel transistor formed in the second semiconductor island;
a fourth n-channel transistor formed in the second semiconductor island, the fourth n-channel transistor including an n-doped region that is shared with the third n-channel transistor;
a second p-channel transistor formed in the second semiconductor island, the second p-channel transistor including a p-doped region that abuts the shared n-doped region of the third and fourth n-channel transistors;
a second silicide region overlying an interface between the p-doped region of the second p-channel transistor and the shared p-doped region of the third and fourth n-channel transistors;
a third polysilicon region for use as a gate of the third n-channel transistor;
a fourth polysilicon region for use as a shared gate of the second p-channel transistor and the fourth n-channel transistor;
a first dielectric layer formed over the first n-channel transistor, the second n-channel transistor, the third n-channel transistor, the fourth n-channel transistor, the first p-channel transistor and the second p-channel transistor;
a first local interconnect electrically coupling the p-doped region of the first p-channel transistor and the fourth polysilicon region, the first local interconnect formed within and substantially co-planar with the first dielectric layer;
a second local interconnect electrically coupling the p-doped region of the second p-channel transistor and the second polysilicon region, the second local interconnect formed within and substantially co-planar with the first dielectric layer;
a second dielectric layer formed over the first dielectric layer, the first local interconnect and the second local interconnect;
a first contact plug extending through the first and second dielectric layers and electrically contacting a second p-doped region of the first p-channel transistor; and
a second contact plug extending through the first and second dielectric layers and electrically contacting a second p-doped region of the second p-channel transistor.

16. The integrated circuit device of claim 15 wherein the first semiconductor island comprises a strained silicon island and wherein the second semiconductor island comprises a strained silicon island.

17. The integrated circuit device of claim 15 wherein the first local interconnect comprises a butted contact and wherein the second local interconnect comprises a butted contact.

18. The integrated circuit device of claim 15 wherein the first local interconnect comprises tungsten and the second local interconnect comprises tungsten.

19. The integrated circuit device of claim 15 wherein the first local interconnect comprises at least one material selected from the group consisting of a group from Cu, AlCu, TiN, TaN, Ti, Co, Ni, W and combinations thereof and wherein the second local interconnect comprises the material of the first local interconnect.

20. The integrated circuit device of claim 15 wherein the first dielectric layer comprises a doped oxide layer.

21. The integrated circuit device of claim 15 wherein the first dielectric layer comprises at least one material selected from the group consisting of PEOX, TEOS, BPTEOS, PSG, HDP oxide, Si3N4, and SiON.

22. The integrated circuit device of claim 21 wherein the second dielectric layer comprises the material of the first dielectric layer.

23. The integrated circuit device of claim 15 wherein the first dielectric layer has a thickness of between 100 nm and 400 nm and wherein the second dielectric layer has a thickness of greater than 20 nm.

24. The integrated circuit device of claim 15 wherein the first dielectric layer comprises a low-k dielectric with a dielectric constant of less than 3.

25. The integrated circuit device of claim 15 wherein the second dielectric layer comprises a low-k dielectric with a dielectric constant of less than 3.

26. A method of manufacturing an integrated circuit, the method comprising:
forming a plurality of transistors in a semiconductor body;
forming a first dielectric layer over the plurality of transistors;
patterning the first dielectric layer with a local interconnect pattern;
filling the local interconnect pattern with a conductor to form a plurality of local interconnects, the local interconnects having an upper surface that is substantially co-planar with an upper surface of the first dielectric layer, and one or more of the formed local interconnects in direct contact with at least one source, drain, or gate;
forming a second dielectric layer over the first dielectric layer and the local interconnects;
etching a plurality of via holes through the first dielectric layer and the second dielectric layer;
filling the via holes with a conductor material; and
forming a metal layer over the second dielectric layer, at least a portion of the metal layer electrically coupled to the conductor material that fills the via holes, wherein the metal layer is patterned to create a plurality of metal lines, at least one of the metal lines overlying but isolated from one of the local interconnects by the second dielectric layer.

27. The method of claim 26 wherein the plurality of transistors comprises at least first and second n-channel transistors and at least first and second p-channel transistors that are electrically coupled to form cross-coupled inverters.

28. The method of claim 27 wherein the local interconnects comprise a first local interconnect and a second local interconnect, wherein the first local interconnect is electrically coupled to a source of the first p-channel transistor, a source of the first n-channel transistor, a gate of the second p-channel transistor and a gate of the second n-channel transistor and wherein the second local interconnect is electrically coupled to a source of the second p-channel transistor, a source of the second n-channel transistor, a gate of the first p-channel transistor and a gate of the first n-channel transistor.

29. The method of claim 28 and wherein the first level of metal includes a wordline conductor layer, the method further comprising depositing a second level of metal over the first level of metal, the second level of metal including a bitline conductor, a complementary bitline conductor, a high voltage supply conductor and a low voltage supply conductor.

30. The method of claim 28 wherein the first level of metal includes a bitline conductor, a complementary bitline conductor and a power supply conductor, the method further comprising depositing a second level of metal over the first level of metal, the second level of metal including a wordline conductor.

31. The method of claim 26 wherein filling the via holes comprises depositing tungsten.

32. The method of claim 26 wherein filling the via holes comprises depositing at least one material selected from the group consisting of Ti, Co, Cu, Ni, a nitrided metal, and a silicide, and combinations thereof.

33. The method of claim 26 wherein the second dielectric layer comprises at least one material selected from the group consisting of oxide, PEOX, TEOS, BPTEOS, PSG, Si3N4, and SiON.

34. The method of claim 26 wherein the second dielectric layer has thickness greater than 20 nm.

35. The method of claim 26 wherein the first dielectric layer has a thickness between 100 nm and 400 nm.

36. The method of claim 26 wherein the semiconductor body comprises a body selected from the group consisting of a bulk-silicon substrate, a non-bulk silicon substrate, a silicon on insulator region, a SiGe region, a strained silicon region, and a composite silicon content substrate.

37. The method of claim 26 wherein etching a plurality of via holes comprises using an etch gas comprising at least one of C4F8, C5F8, CH2F2, and N2.

38. The method of claim 26 wherein etching a plurality of local interconnect patterns comprises using an etch gas comprising at least one of C4F8, C5F8, CH2F2, and N2.

39. The method of claim 26 wherein first dielectric layer has a thickness of less than 250 nm.

40. The method of claim 26 wherein at least one of the local interconnect patterns has a minimum width of less than 90 nm.

41. The method of claim 26 wherein filling the local interconnect pattern comprises depositing at least one of W, Al, AlCu, Cu, silicide, TiN, TiW, and TaN.

42. The method of claim 26 wherein filling the via holes comprises depositing at least one of W, Al, AlCu, Cu, silicide, TiN, TiW, and TaN.

* * * * *